(12) United States Patent
Hanafi

(10) Patent No.: US 8,324,676 B2
(45) Date of Patent: *Dec. 4, 2012

(54) MEMORY CELL STORAGE NODE LENGTH

(75) Inventor: Hussein I. Hanafi, Basking Ridge, NJ (US)

(73) Assignee: Micron Technology, Inc., Boise, ID (US)

( * ) Notice: Subject to any disclaimer, the term of this patent is extended or adjusted under 35 U.S.C. 154(b) by 154 days.

This patent is subject to a terminal disclaimer.

(21) Appl. No.: 12/639,223

(22) Filed: Dec. 16, 2009

(65) Prior Publication Data

US 2010/0091577 A1    Apr. 15, 2010

Related U.S. Application Data

(63) Continuation of application No. 11/870,128, filed on Oct. 10, 2007, now Pat. No. 7,646,053.

(51) Int. Cl.
*H01L 29/788* (2006.01)

(52) U.S. Cl. ............... 257/315; 257/321; 257/E29.129; 257/E21.422

(58) Field of Classification Search .............. 257/304, 257/324, E27.094, 315, 321, E29.129, E29.3, 257/E21.179, E21.422, E21.68
See application file for complete search history.

(56) References Cited

U.S. PATENT DOCUMENTS

| | | | |
|---|---|---|---|
| 5,886,379 A | | 3/1999 | Jeong |
| 6,475,863 B1 * | | 11/2002 | Kim .............................. 438/264 |
| 6,509,603 B2 * | | 1/2003 | Lin et al. ....................... 257/315 |
| 6,521,963 B1 * | | 2/2003 | Ota et al. ....................... 257/412 |
| 7,223,663 B2 * | | 5/2007 | Kim ................................ 438/302 |
| 7,646,053 B2 * | | 1/2010 | Hanafi .......................... 257/304 |
| 2002/0003255 A1 * | | 1/2002 | Usuki et al. ................... 257/316 |
| 2003/0201487 A1 * | | 10/2003 | Yang et al. .................... 257/314 |
| 2004/0266108 A1 | | 12/2004 | Hsiao et al. |
| 2008/0157169 A1 * | | 7/2008 | Yuan ............................. 257/319 |
| 2008/0265306 A1 | | 10/2008 | Van Schaijk et al. |

OTHER PUBLICATIONS

Artitome, S., et al., "A Reliable Bi-Polarity Write/Erase Technology in Flash EEPROMs", IEDM, pp. 90-111-90-114 (1990).
Bellens, Rudi, et al., "Hot-Carrier Degradation Behavior of N- and P-Channel Mosfet's Under Dynamic Operation Conditions", IEEE Transactions on Electron Devices, vol. 41, No. 8 (Aug. 1994).
Cernea, Raul-Adrian, et al. "Session 10: Non-Volatile Memories THAM 10.6: A 1Mb Flash EEPROM", IEEE International Solid-State Circuits Conference, Digest of Technical Papers, pp. 138-139 and 316, ISSCC 89 (1989).
Farmer, K.R., et al., "Tunnel electron induced charged generation in very thin silicon oxide", Appl. Phys. Lett., vol. 58, No. 23 (Jun. 10, 1991).

(Continued)

*Primary Examiner* — Eduardo A Rodela
(74) *Attorney, Agent, or Firm* — Brooks, Cameron & Huebsch, PLLC

(57) ABSTRACT

Methods, devices, and systems for a memory cell are provided. One embodiment includes a memory cell with a storage node separated from a body region by a first dielectric, wherein the body region includes a channel separating a source and a drain region, and wherein a length of the storage node is less than a length of the channel. The embodiment further includes a memory cell with a gate separated from the storage node by a second dielectric, wherein a length of the gate is greater than a length of the storage node.

20 Claims, 10 Drawing Sheets

OTHER PUBLICATIONS

Hanafi, H.I., et al., "A controlled threshold low power nano-crystal memory," ESSDERC '95, Proceeding of the 25th European Solid State Device Research Conference, Editions Frontieres, Gif sur Yvette, France (1995).

Hanafi, et al., "Fast and Long Retention-Time Nano-Crystal Memory,"IEEE Transactions on Electron Devices, vol. 43, No. 9 (Sep. 1996).

Runnion, E.F., "Limitations on Oxide Thicknesses in FLASH EEPROM Applications", IEEE International Reliability Physics Symposium, pp. 93-99, IEEE (1996).

Troutman, Ronald R., "VLSI Limitations from Drain-Induced Barrier Lowering", IEEE Transactions on Electron Devices, vol. ED-26, No. 4 (Apr. 1979).

Wang, Samuel, T., "Charge Retention of Floating-Gate Transistors Under Applied Bias Conditions", IEEE Transactions on Electron Devices, vol. ED-27, No. 1 (Apr. 1980).

* cited by examiner

MEMORY CELL STORAGE NODE LENGTH

CROSS-REFERENCE TO RELATED APPLICATIONS

This application is a Continuation of U.S. application Ser. No. 11/870,128, filed Oct. 10, 2007, the entire specification of which is herein incorporated by reference.

BACKGROUND

Flash EEPROM (Electrically Erasable and Programmable Memory) are a popular form of non-volatile memory. Flash EEPROM is operated by injecting electrons to a floating gate by tunneling into a floating gate through a tunneling oxide layer to cause a threshold voltage shift that is detected via current sensing. The magnitude of this threshold shift is related to the charge in the floating gate, the thickness of the controlling tunnel oxide, and other device parameters. To achieve non-volatility in Flash EEPROM's, the tunneling oxide thickness is maintained high enough (>7 nanometers (nm)) so as to prevent floating gate charge loss to the source and drain regions under normal read and retention conditions. The use of large oxide thicknesses, e.g. greater than 7 nm, necessitates the injection of charge into the floating gate at large voltages, e.g. 20 V, which results in MOSFET transistor hot-carrier degradation. As MOSFET transistors are being scaled down to achieve higher memory chip densities, the continuing use of large tunneling oxide thicknesses can result in poor memory transistor characteristics such as degraded read and write times and increased power consumption associated with chip standby as well as active modes.

DETAILED DESCRIPTION

Methods, devices, and systems for a memory cell are provided. One embodiment includes a memory cell with a storage node separated from a body region by a first dielectric, wherein the body region includes a channel separating a source and a drain region, and wherein a length of the storage node is less than a length of the channel. The embodiment further includes a memory cell with a gate separated from the storage node by a second dielectric, wherein a length of the gate is greater than a length of the storage node.

As used in this disclosure, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
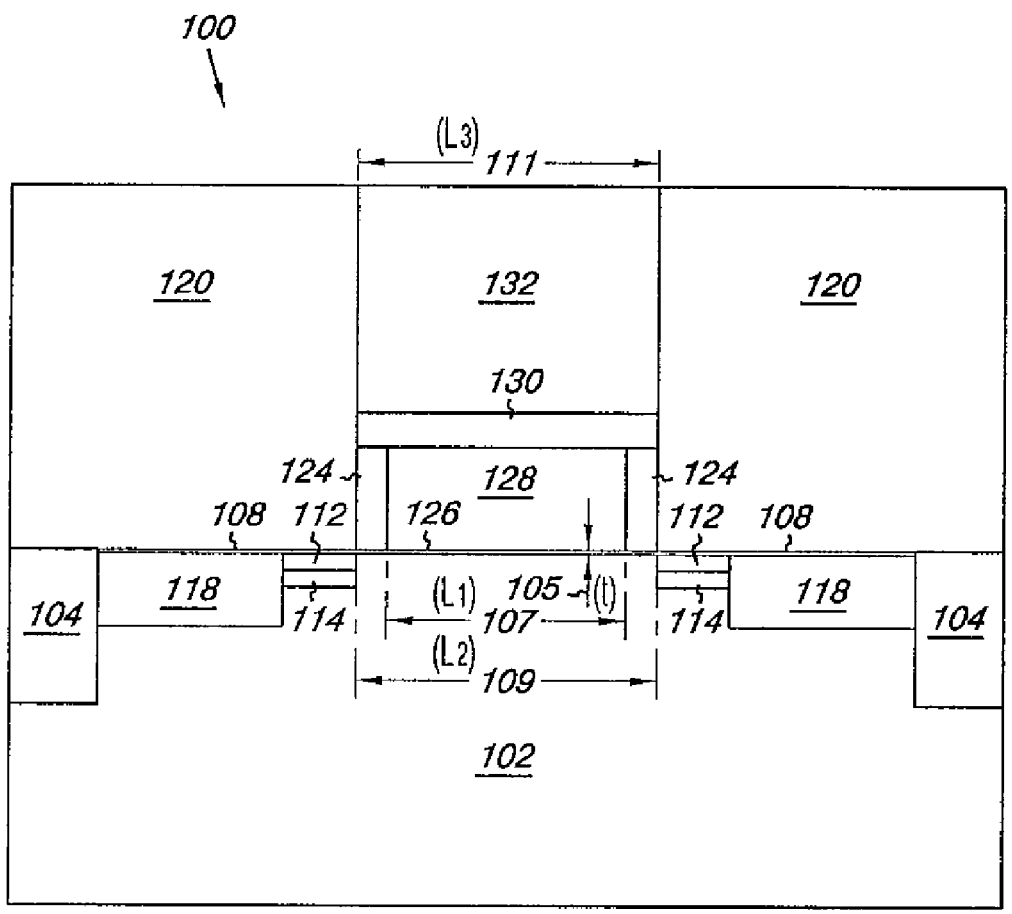
FIG. 1 illustrates an embodiment of a memory cell according to the present invention.

FIG. 1 illustrates an embodiment of a memory cell 100 according to the present invention. The embodiment of FIG. 1 includes a memory cell 100 with a first dielectric 126, e.g., tunneling oxide layer ($SiO_2$), separating a storage node 128, e.g., floating gate, from a channel region separating source/drain regions 118 of a semiconductor substrate 102. The first dielectric has a thickness (t) 105. In one or more embodiments the first dielectric 126 has a thickness of less than 5 nanometers (nm). In one or more embodiments a length (L1) 107 of the storage node 128 is less than a length (L2) 109 between the source and drain regions. In the embodiment shown in FIG. 1, a gate 132, e.g., control gate, is separated from the storage node 128 by a second dielectric 130. In one or more embodiments, a length (L3) 111 of the gate 132 is greater than a length (L1) 107 of the storage node 128.

Although, for ease of illustration, the embodiment of FIG. 1 will be discussed in relation to a non-volatile floating gate memory cell, one of ordinary skill in the art will appreciate that embodiments are not so limited.

As shown the embodiment of FIG. 1, the memory cell 100 can be formed on a substrate layer 102 with shallow trench isolation (STI) regions 104, e.g., a silicon (Si) substrate from a bulk silicon wafer that can have a p-type dopant, such as Boron (B), or an n-type dopant, such as Arsenic (As) or phosphorous (P), implanted in the substrate. As the reader will appreciate, the memory cell 100 can be configured either as a p-type memory cell or as an n-type memory cell depending on choice of doping.

According to one or more embodiments, the tunneling oxide layer 126 of the memory cell 100 can be formed of silicon dioxide ($SiO_2$). In one or more embodiments, the floating gate 128 is separated from the surface of the substrate 102 by a tunneling oxide layer 126 that is less than 5 nm thick. In one or more embodiments, electron charge is stored in the floating gate 128, which can be associated with tunneling of the charge, with methods such as direct tunneling, or Fowler-Nordheim tunneling or channel hot electron injection, from the substrate 102 to the floating gate 128 through the tunneling oxide layer 126 that causes a shift in the threshold voltage for the memory cell 100. In one or more embodiments, the direct tunneling of the charge through a tunneling oxide layer 126 that is less than 5 nm thick allows for improved read and write times for the memory cell 100 and lowers the degradation of the memory cell 100 by reducing hot carrier effects. According to one or more embodiments, Fowler Nordheim tunneling through a tunneling oxide layer 126 above 5 nm thickness can still achieve improved retention times.

As shown in FIG. 1, the memory cell 100, also includes source/drain regions 118 structured such that current can flow between the source/drain regions 118 at least partially in response to the memory cell 100 being "on". As mentioned above, tunneling oxide layer 126 has a thickness (t) 105 of 5 nanometers (nm) or less. When tunneling oxide layer 126 is at a thickness of 5 nm or less in a design rule regime of 90 nm or less, improved read and write times for the memory cell 100 can be achieved when direct tunneling of a charge to the floating gate 128 is used. However, floating gate charge loss is primarily through the source/drain regions 118, not the body region 102, which is directly below the floating gate 128. This is due to the smaller work function difference between the floating gate 128 and the source/drain regions 118, as they have the same doping type. Therefore, in one or more embodiments, to decrease floating gate charge loss, the floating gate 128 is under-lapped, e.g. the floating gate length (L1) 107 is less than the channel length (L2) 109, where the channel length (L2) 109 is the area of the body region 102 between the source/drain extensions (SDEs) 112. The under-lapping can be achieved by forming nitride spacers 124 on the sides of tetra-ethyl-ortho-silicate (TEOS) regions 120. Thus, in one or more embodiments, an increase retention time for the charge can be achieved by reducing the amount of floating gate charge loss by under-lapping the floating gate, which increases the lateral distance between the floating gate and the source/drain region. Furthermore, lower operation voltages can be achieved with the tunnel oxide layer thickness being less than 5 nm.

In operation, the current flow in the memory cell 100 can be between the source/drain regions 118. As shown in FIG. 1, a control gate 132 is provided to turn the device on and provide a channel in the device such that a potential can be established between the source/drain regions 118. The embodiment of the memory cell 100 in FIG. 1, illustrates a control gate dielectric 130 separating the control gate 132 from the floating gate 128. The floating gate 128 is charged and stores the charge to control the threshold voltage of the device. In one or more embodiments, the memory cell 100 can have an oxide layer 108 that separates the source/drain regions from the TEOS regions 120 and source/drain halo regions 114, can be implanted to improve the short channel characteristics of the device.

Figure 2A:
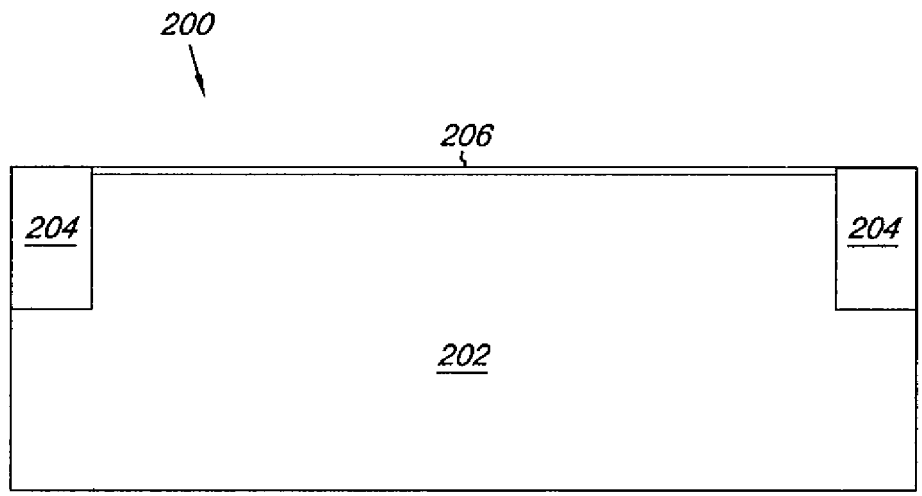
FIGS. 2A-2N illustrate an embodiment of a method of forming a memory cell according to the present invention.
Figure 2B:
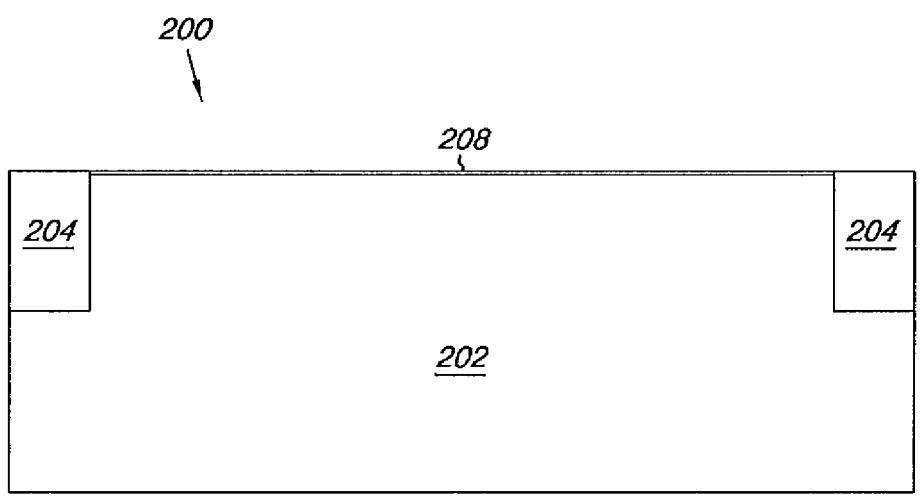
Figure 2C:
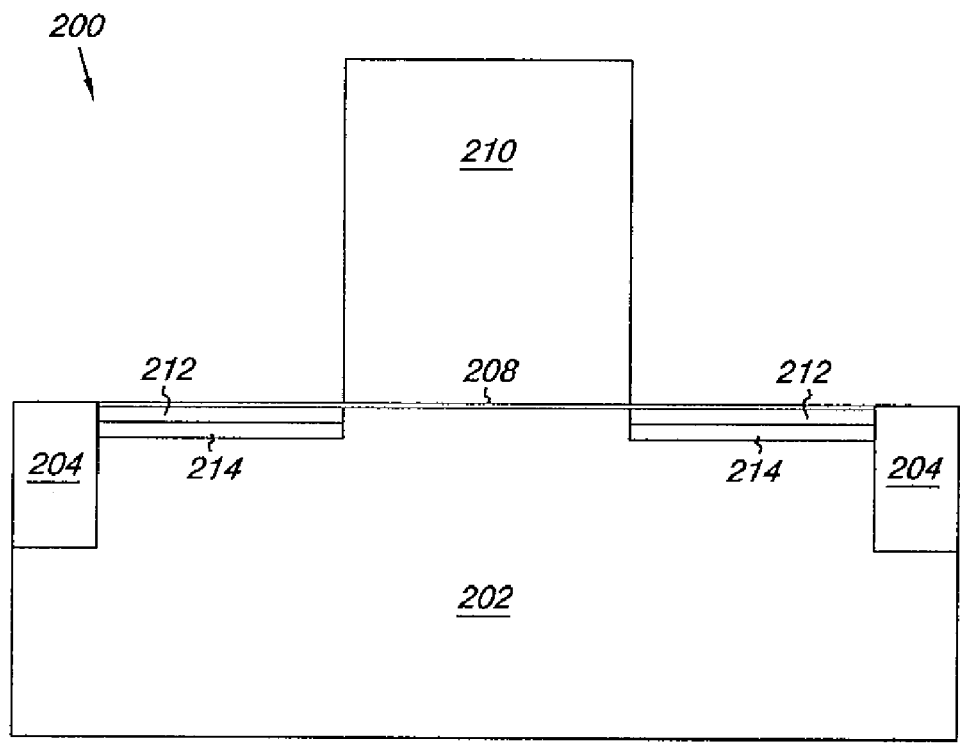
Figure 2D:
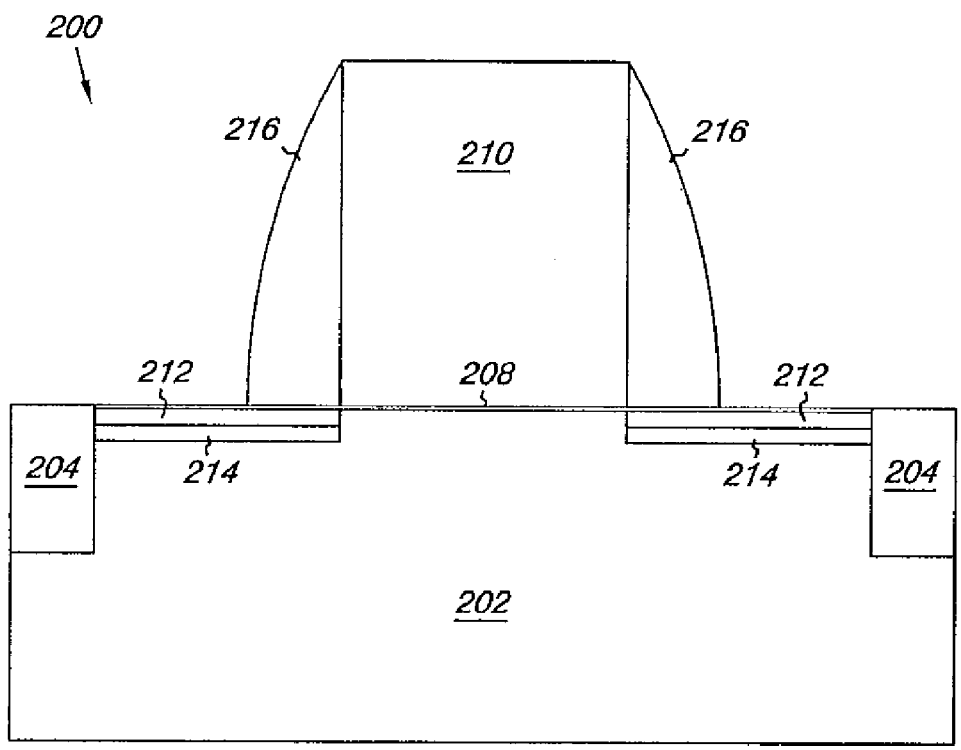
Figure 2E:
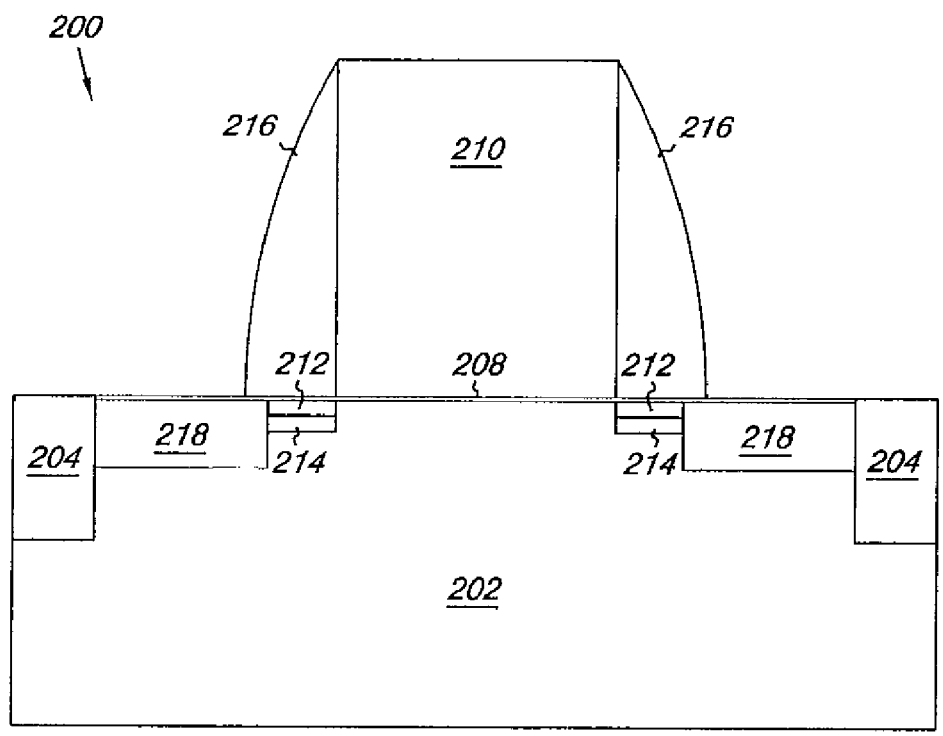
Figure 2F:
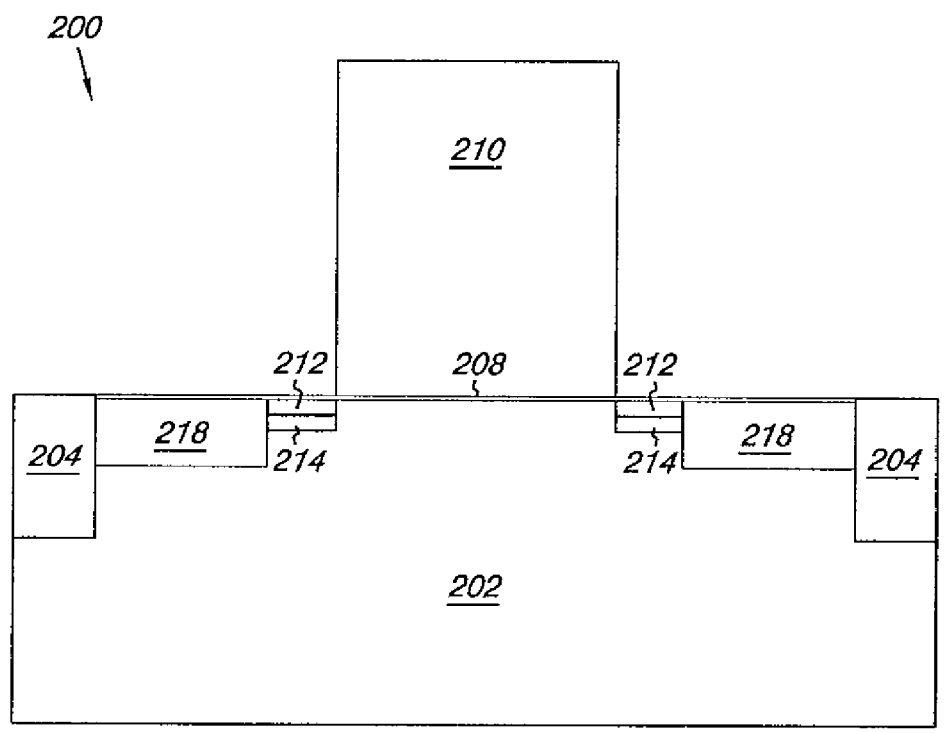
Figure 2G:
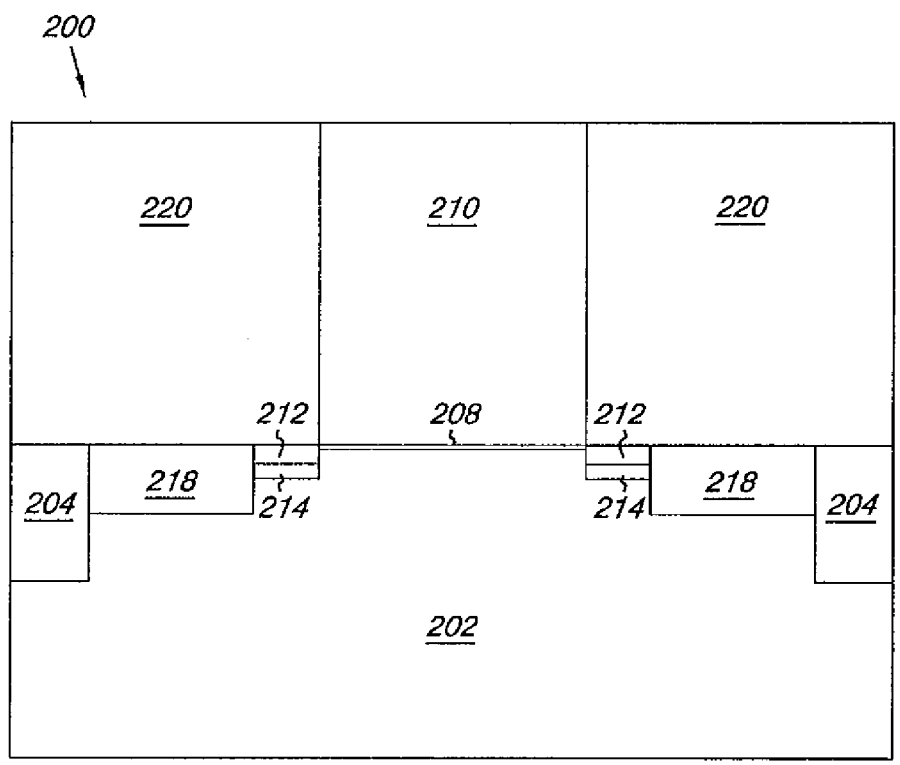
Figure 2H:
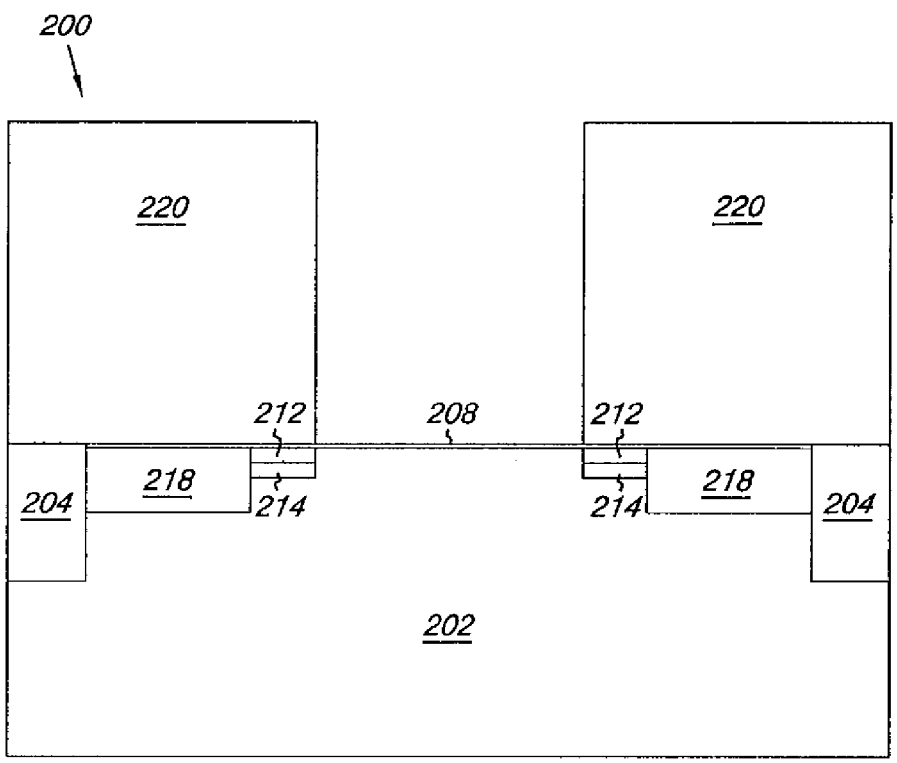
Figure 2I:
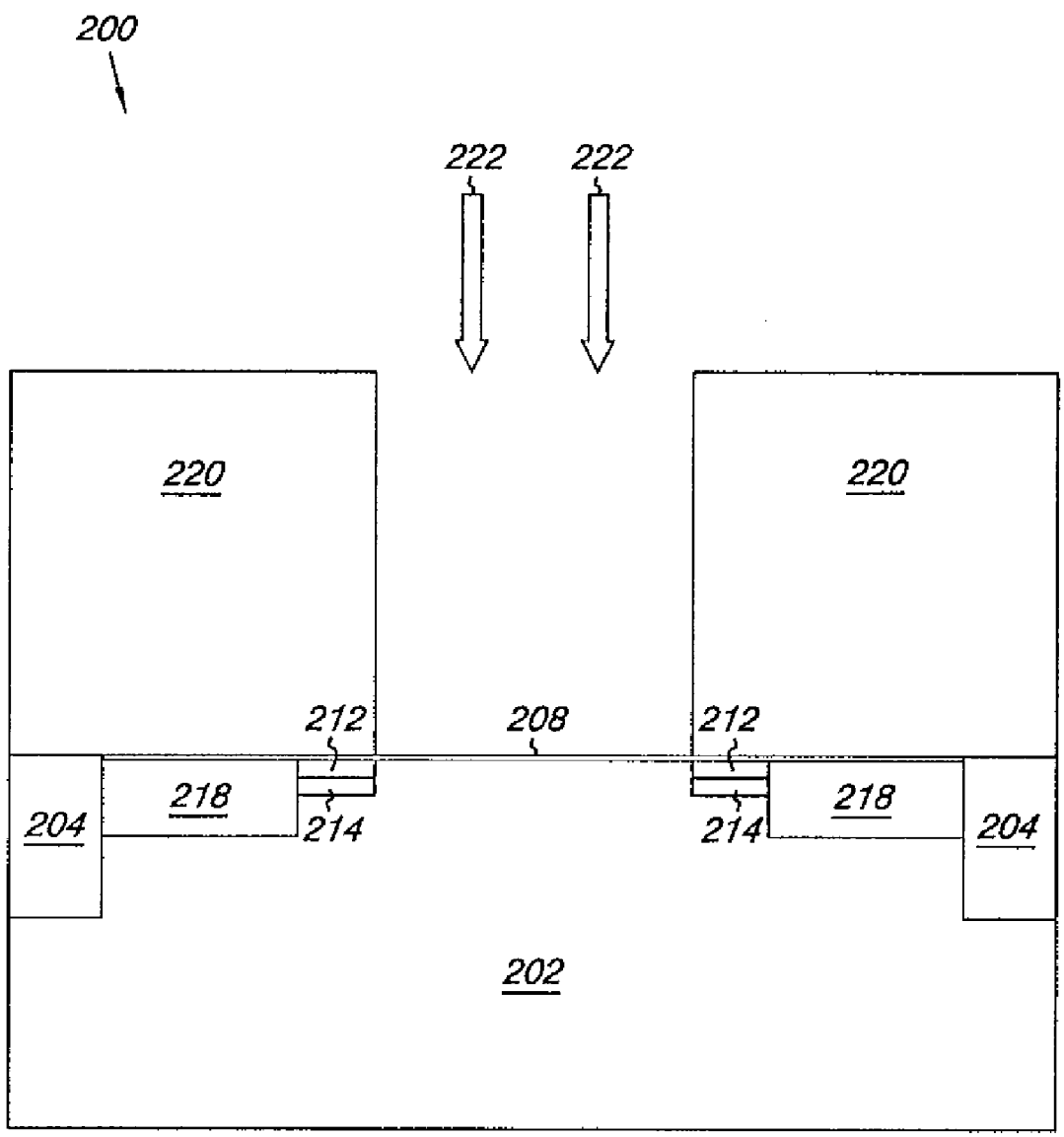
Figure 2J:
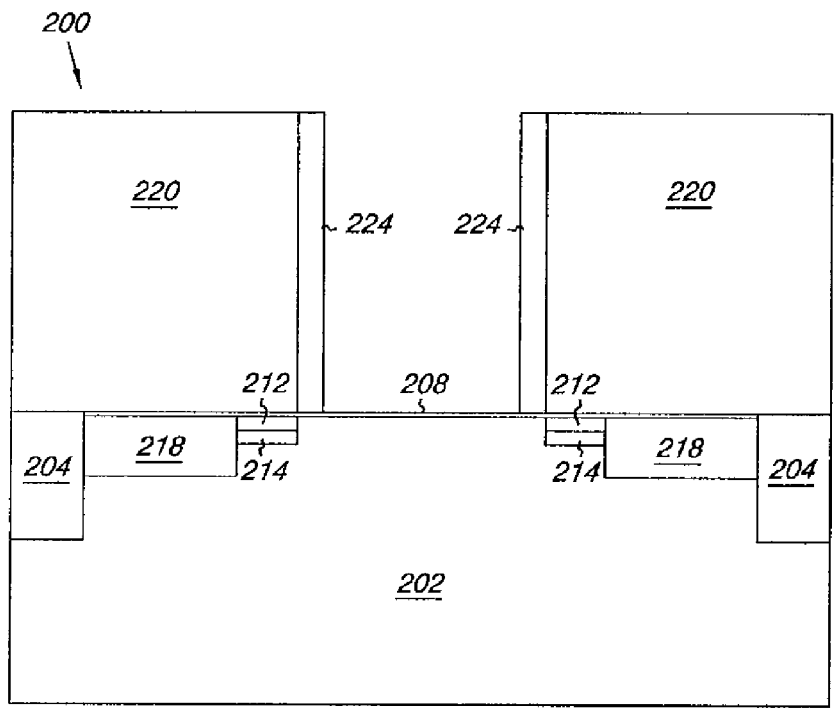
Figure 2K:
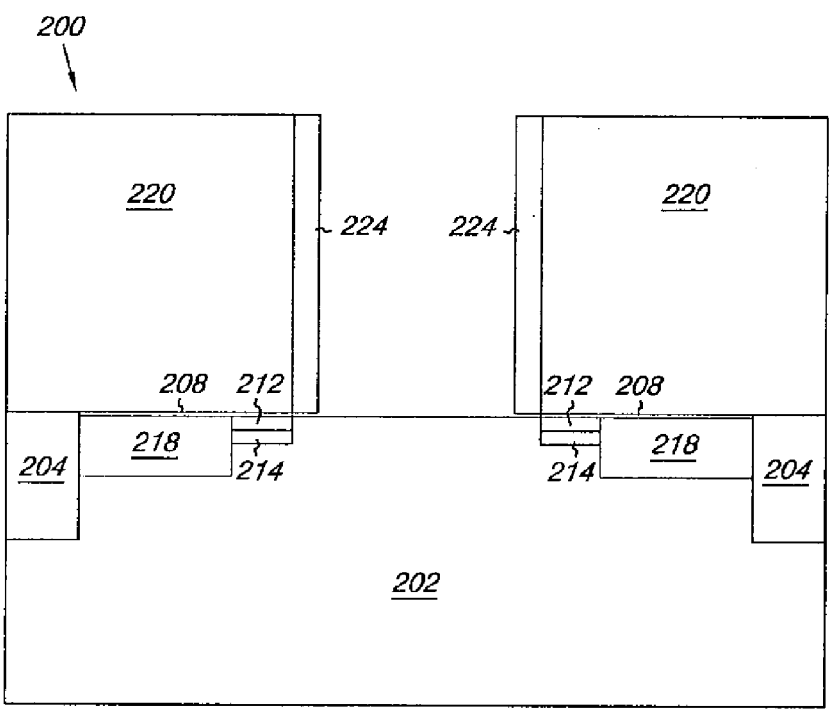
Figure 2L:
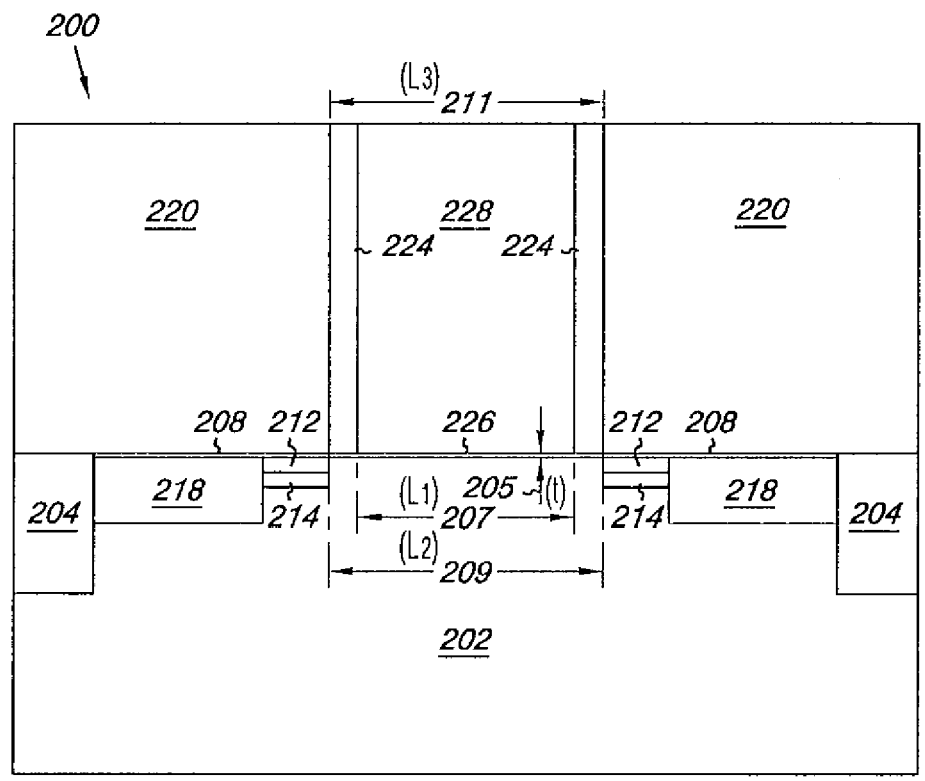
Figure 2M:
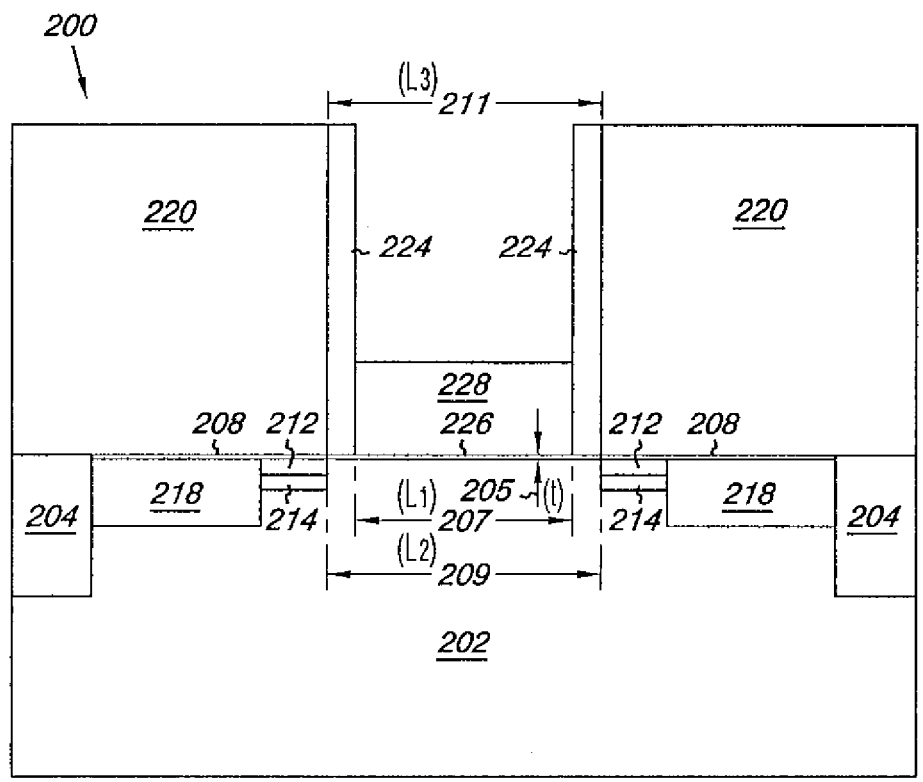
Figure 2N:
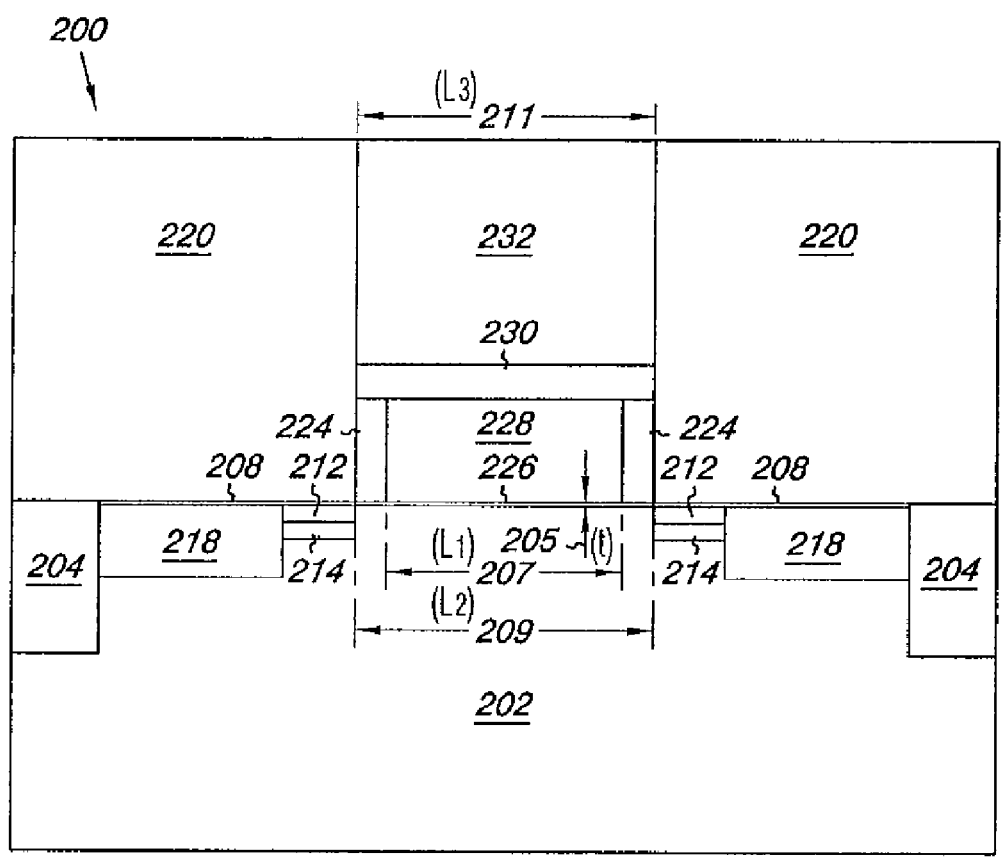

FIGS. 2A-2N illustrate an embodiment of a method of forming a memory cell, e.g., memory cell 100 in FIG. 1, according to the present invention. As shown in FIG. 2N, the embodiment of FIGS. 2A-2N forms a first dielectric 226 having a thickness (t) 205, e.g., tunneling oxide layer (SiO$_2$), separating a storage node 228, e.g., floating gate, from a channel region separating source/drain regions 218 of a semiconductor substrate 202. In one or more embodiments the first dielectric 226 is formed to have a thickness of less than 5 nanometers (nm). In one or more embodiments, the method forms a storage node 128 having a length (L1) 207 which is less than a length (L2) 209 of the channel region. As further shown in FIG. 2N, such an embodiment of a method can also form a gate 232, e.g., control gate, separated from the storage node 228 by a second dielectric 230. In one or more embodiments, the gate 232 has a length (L3) 211 which is greater than a length (L1) 207 of the storage node 228.

Although, for ease of illustration, the embodiment of FIGS. 2A-2N will be discussed in relation to forming a non-volatile floating gate memory cell, one of ordinary skill in the art will appreciate that embodiments are not so limited. The memory cell shown in FIGS. 2A-2N can be configured to be an n-type memory cell or a p-type memory cell depending on choice of doping.

FIG. 2A illustrates an embodiment of a method for forming the memory cell 200 at a particular point in time in a fabrication process. As shown in the embodiment of FIG. 2A, a silicon wafer 202 acts as a substrate for the fabrication process. The silicon layer 202 can be formed on an insulator layer (not shown) to act as a silicon on insulator (SOI) substrate for the fabrication process. The silicon layer 202 can be doped with boron (B) to make the substrate a p-type substrate 202 when forming an n-type memory cell. The silicon layer 202 can be doped with arsenic (As) or phosphorous (P) to make the substrate an n-type substrate 202 when forming a p-type memory cell.

In one or more embodiments, shallow trench isolation (STI) regions 204 can be formed in the substrate 202, such as to provide isolation for the memory cell 200 from other memory cells or other electrical elements that may be located on the same wafer or in the vicinity of the memory cell 200. The STI regions 204 are formed to a depth to provide adequate isolation for the source/drain regions and channel region in the memory cell. A depth of approximately 150 nm can provide the required isolation. In one or more embodiments, a pad oxide layer 206 can be formed over the silicon substrate 202 to a height of approximately 8 nm. The pad oxide layer 206 is used to protect the surface of the silicon substrate 202 during the formation of shallow trench isolation (STI). The pad oxide layer 206 will be replaced by a sacrificial layer, discussed below, to protect the area where the tunneling oxide layer and gate structures will be formed. This pad oxide layer 206 can be formed on the silicon substrate layer 202 using thermal oxidation, chemical vapor deposition (CVD), physical vapor deposition (PVD) or another suitable technique. In the example embodiment shown in FIG. 2A, the pad oxide layer 206 can be made of a silicon dioxide (SiO$_2$) or any other suitable oxide. The pad oxide layer 206 can be used to clean the surface of the silicon substrate 202 for the sacrificial oxide layer, tunneling oxide layer, and gate structures that will be formed on the silicon substrate 202 in subsequent fabrication steps.

FIG. 2B illustrates an embodiment of a method for forming the memory cell of FIG. 2N at another particular point in a semiconductor fabrication sequence. As shown in FIG. 2B, the pad oxide layer 206 has been removed, e.g., using an HF acid wash, in preparation for further fabrication steps to be performed on the exposed surface. Such a process can leave the surface of the silicon substrate 202 exposed and in a clean condition. As shown in FIG. 2B, a sacrificial oxide layer 208 can then be formed on the surface of the silicon substrate 202 between the STI regions 104. The sacrificial oxide layer 208 can be formed to a thickness of approximately 6 nm. The sacrificial oxide layer 208 can be used as a passivation layer during the formation, implantation, and annealing of the source/drain regions, the source/drain extensions, and the halo regions. The sacrificial oxide layer 208 can be formed on the silicon substrate layer 202 using thermal oxidation, chemical vapor deposition (CVD), physical vapor deposition (PVD) or another suitable technique. In the example embodiment shown in FIG. 2B, the sacrificial oxide layer 208 can be made of a silicon dioxide (SiO$_2$) or any other suitable dielectric. In one or more embodiments, the sacrificial oxide layer 208 can be removed by using an HF acid wash leaving the surface of the silicon substrate 202 exposed and prepared for the formation of the tunneling oxide layer.

FIG. 2C illustrates an embodiment of a method for forming the memory cell of FIG. 2N at another particular point in a semiconductor fabrication sequence. FIG. 2C illustrates the formation of a sacrificial gate, the source/drain extensions, and the halo implant regions for a memory cell. In FIG. 2C, a sacrificial gate 210 can be formed on silicon substrate 202 separated by the sacrificial oxide layer 208. In one or more embodiments, the sacrificial gate 210 can be formed by depositing a thick poly-silicon layer, e.g., 150 nm thick, over the silicon substrate 202. The poly-silicon layer can be formed by chemical vapor deposition (CVD), physical vapor deposition (PVD) or other suitable techniques. The poly-silicon layer can be patterned and partially removed by photolithography techniques, as the same are known and understood by one of ordinary skill in the art. The removal technique leaves a sacrificial gate 210 over the silicon substrate at a width that will define the channel length for the memory cell 200 and the location of the source/drain regions and source/drain extensions and also help define the underlap of the floating gate.

In FIG. 2C, the source/drain extensions (SDEs) 212 are shown at opposite sides of the sacrificial gate 210. In one or more embodiments, the SDEs 212 may be formed by lightly doping an area below the surface of the exposed silicon substrate 202. In one or more embodiments, the SDE implantation for an n-type memory cell 200 can include doping SDE regions 212 with an n-type dopant such as arsenic (As) or phosphorous (P) using an ion implantation and annealing at a dose of approximately $5 \times 10^{14}$ atoms/cm$^2$ to form an n-type doping concentration of approximately $2 \times 10^{19}$ atoms/cm$^3$ to a depth of approximately 25 nm, for example. The SDE implantation for the p-type memory cell 200 can include doping SDE 212 with a p-type dopant such as boron (B) using an ion implantation at a dose of approximately $5 \times 10^{14}$ atoms/cm$^2$ to form an p-type doping concentration of approximately $2 \times 10^{19}$ atoms/cm$^3$ to a depth of approximately 25 nm. One or more embodiments are not so limited to the dopant types, doses, and concentrations described herein.

In one or more embodiments, a halo implantation can then be performed to create halo regions 214 under the SDEs 212 of the memory cell 200. In one or more embodiments, the halo implantation for the n-type memory cell can include doping halo regions 214 with a p-type dopant such as boron (B) using an ion implantation at a dose of approximately $5 \times 10^{13}$ atoms/cm$^2$ to form an p-type doping concentration of approximately $2 \times 10^{18}$ atoms/cm$^3$ to a depth of approximately 50 nm. In one or more embodiments, the halo implantation for the p-type memory cell 200 can include doping halo regions 214 with an n-type dopant such as arsenic (As) or phosphorous (P) using an ion implantation at a dose of approximately $5 \times 10^{13}$ atoms/cm$^2$ to form an n-type doping concentration of approximately $2 \times 10^{18}$ atoms/cm$^3$ to a depth of approximately 50 nm. These examples are given by way of illustration and not by way limitation.

FIG. 2D illustrates an embodiment of a method for forming the memory cell of FIG. 2N at another particular point in a semiconductor fabrication sequence. In FIG. 2D, nitride spacers 216 are formed on the sidewalls of the sacrificial gate 210. As the reader will appreciate, the nitride spacers 216 can be formed using a conformal deposition of nitride followed by an ion etch to remove the nitride from a top surface of the gates 210. An ion etch can also expose a portion of a top surface of the SDEs 212, which can be spaced further from the sacrificial gate 210 by the nitride spacer.

More heavily doped source/drain (S/D) regions can then be formed for the memory cell 200. As noted with FIG. 2C, the sacrificial gate 210 can be used to define the channel length for the memory cell. The nitride spacers 216, as shown in FIG. 2D, can define the location of the source/drain region according to their location relative to the sacrificial gate 210. The nitride spacers 216 can be used to limit the area where the source/drain implantation occurs and thus the location of where source/drain regions are located once the annealing process has driven in the dopants. The nitride spacers 216 can allow the more heavily doped source/drain regions to be located further from the channel and the floating gate. This can help in improving device short channel characteristics and provide improved device performance.

FIG. 2E illustrates an embodiment of a method for forming the memory cell of FIG. 2N at another particular point in a semiconductor fabrication sequence. FIG. 2E illustrates the formation of the source/drain regions of the memory cell 200. Implanting the S/D regions 218 for a p-type memory cell can include doping S/D regions 218 with a p-type dopant such as boron (B) using an ion implantation at a dose of approximately $5 \times 10^{15}$ atoms/cm$^2$ to form a p-type doping concentration of approximately $2 \times 10^{20}$ atoms/cm$^3$ to a depth of approximately 100 nm. Implanting the S/D region 218 for an n-type memory cell can include doping S/D regions 218 with an n-type dopant such as arsenic (As) or phosphorous (P) using an ion implantation at a dose of approximately $5 \times 10^{15}$ atoms/cm$^2$ to form an n-type doping concentration of approximately $2 \times 10^{20}$ atoms/cm$^3$ to a depth of approximately 100 nm. Once the S/D regions 218 are implanted, the S/D regions 218 are annealed to drive in the dopants and activate the S/D regions 218. In one or more embodiments, the S/D regions 218 can be annealed at a temperature in the range of approximately 850 degrees Celsius (° C.) to 1050° C. for approximately 5 seconds. These examples are given by way of illustration and not by way limitation.

FIG. 2F illustrates an embodiment of a method for forming the memory cell of FIG. 2N at another particular point in a semiconductor fabrication sequence. As shown in FIG. 2F, the nitride spacers 216 on the structure associated with what will become the memory cell, e.g., structure 200, have been removed, e.g., using a $H_3PO_4$ acid wash, in preparation for the formation of the tunneling oxide layer, the floating gate and the control gate. The nitride spacers are removed leaving the sacrificial gate 210, which defines the channel length, along with the S/D regions 218, the SDEs 212, and the halo regions 214, which have all been formed.

FIG. 2G illustrates an embodiment of a method for forming the memory cell of FIG. 2N at another particular point in a semiconductor fabrication sequence. As shown in the embodiment of FIG. 2G an oxide layer, e.g., tetra-ethyl-ortho-silicate (TEOS) is deposited over the whole wafer using CVD, PVD, or another suitable technique. The oxide layer can be planarized to a level even with the sacrificial gate 210, e.g., using CMP or another suitable technique, to form a hard mask 220.

FIG. 2H illustrates an embodiment of a method for forming the memory cell of FIG. 2N at another particular point in a semiconductor fabrication sequence. As shown in FIG. 2H, the sacrificial gate 210 is removed from memory cell 200, exposing the silicon substrate 202 and the sacrificial oxide layer 208. The removed sacrificial gate 210 leaves an area on the silicon substrate to form the tunneling oxide layer and the control gate throughout the entire length of the channel, while forming an under-lapped floating gate through other fabrication techniques that will be discussed in conjunction with FIGS. 2J-2M.

FIG. 2I illustrates an embodiment of a method for forming the memory cell of FIG. 2N at another particular point in a semiconductor fabrication sequence. In FIG. 2I, the memory cell body implantation is shown. The body region (and channel) implant 222 for a p-type memory cell can include doping body regions with an n-type dopant such as arsenic (As) or phosphorous (P) using an ion implantation at a dose of approximately $5 \times 10^{12}$ atoms/cm$^2$ to form a p-type doping concentration of approximately $2 \times 10^{17}$ atoms/cm$^3$ to a depth of approximately 100 nm. The body region implant for an n-type memory cell can include doping the body regions with a p-type dopant such as boron (B) using an ion implantation at a dose of approximately $5 \times 10^{12}$ atoms/cm$^2$ to form an n-type doping concentration of approximately $2 \times 10^{17}$ atoms/cm$^3$ to a depth of approximately 100 nm. Once the body regions are implanted, the body regions are annealed to drive in the dopants and activate the body regions. In one or more embodiments, the body regions can be annealed at a temperature in the range of approximately 850 degrees Celsius (° C.) to 1050° C. for approximately 5 seconds. These examples are given by way of illustration and not by way limitation.

FIG. 2J illustrates an embodiment of a method for forming the memory cell of FIG. 2N at another particular point in a semiconductor fabrication sequence. FIG. 2J illustrates the formation of nitride spacers 224 on the interior sidewalls of the hard mask 220 for the memory cell 200. As the reader will appreciate, the nitride spacers 224 can be formed using a conformal deposition of nitride to a thickness of approximately 15 nm. Then a portion of the nitride can be removed by reactive ion etching (RIE) to leave the nitride spacers 224 at a thickness in a range of 5 nm to 10 nm.

FIG. 2K illustrates an embodiment of a method for forming the memory cell of FIG. 2N at another particular point in a semiconductor fabrication sequence. FIG. 2K illustrates the removal of the sacrificial oxide layer 208 from the surface of the silicon substrate 202 for the memory cell 200. The sacrificial oxide layer 208 can be removed, e.g., by an HF acid wash leaving the surface of the silicon substrate 202 exposed and prepared for the formation of the tunneling oxide layer. The removal of the sacrificial oxide layer 208 leaves an area under the nitride spacer 224 open and ready for the formation of the tunneling oxide in that area.

FIG. 2L illustrates an embodiment of a method for forming the memory cell of FIG. 2N at another particular point in a semiconductor fabrication sequence. FIG. 2L illustrates the formation of the tunneling oxide layer 226 and the deposition of the floating gate material 228. The tunneling oxide layer 226 can be formed on the silicon substrate layer 202 in area that was exposed by the removal of the sacrificial oxide layer 208 using thermal oxidation, chemical vapor deposition (CVD), physical vapor deposition (PVD) or another suitable technique. The tunneling oxide can be formed on entire length the silicon surface 202 that is bounded by the hard mask 220. In the example embodiment shown in FIG. 2L, the tunneling oxide layer 226 can be made of a silicon dioxide ($SiO_2$) or any other suitable dielectric. The tunneling oxide layer 226 can be formed to a thickness (t) 205 that is less than 5 nm. When the tunneling oxide is formed to thickness (t) 205 of less than 5 nm, the read and write times for the memory cell 200 can be improved.

Once the tunneling oxide layer 226 has been formed on the silicon substrate 202, the floating gate material 228 can be deposited. The floating gate material 228 can be any suitable material such as poly-silicon or a metal. The floating gate material 228 can be formed to fill the area between the nitride spacers 224 and the above tunneling oxide layer 226. CMP can be used to planarize the floating gate material 228 to the surface of the hard mask 220.

FIG. 2M illustrates an embodiment of a method for foaming the memory cell of FIG. 2N at another particular point in a semiconductor fabrication sequence. FIG. 2M illustrates the formation of the floating gate 228. The floating gate 228 can be formed by using reactive ion etching (RIE) to remove a portion of the floating gate material, e.g. poly-silicon or a metal. As shown in FIG. 2M, the floating gate 228 has been formed to a length (L1) 207, which is defined by the distance between the nitride spacers 224 and which is less than the length of the channel (L2) 209, e.g. the distance between the SDEs 212. The floating gate 228 is undercut, as it does not traverse the entire length of the channel (L2) 209.

The floating gate 228 can be implanted and annealed after the thickness of the floating gate is define by RIE. The floating gate implant for a p-type memory cell can include doping the floating gate 228 with an n-type dopant such as arsenic (As) or phosphorous (P) using an ion implantation at a dose of approximately $5\times10^{15}$ atoms/$cm^2$ to form a p-type doping concentration of approximately $2\times10^{20}$ atoms/$cm^3$ to a depth of approximately 100 nm. The floating gate implant for an n-type memory cell can include doping the floating gate with a p-type dopant such as boron (B) an ion implantation at a dose of approximately $5\times10^{15}$ atoms/$cm^2$ to form an n-type doping concentration of approximately $2\times10^{20}$ atoms/$cm^3$ to a depth of approximately 100 nm. Once the floating gate is implanted, the floating gate can be annealed to drive in and activate the floating gate dopant. In one or more embodiments, the floating gate can be annealed at a temperature in the range of 850 degrees Celsius (° C.) to 1050° C. for approximately 5 seconds. These examples are given by way of illustration and not by way limitation.

FIG. 2N illustrates the formation of the control gate dielectric and the control gate. In FIG. 2N, once the floating gate 228 is formed, the nitride spacers 224 can be etched by CMP, RIE, or any other suitable technique to the surface of the floating gate 228. The control gate dielectric 230 is then formed on top of the floating gate. The control gate dielectric can be any suitable dielectric such as silicon dioxide ($SiO_2$) or a dielectric with a dielectric constant (K) greater than 12. The control gate dielectric 230 is formed between the hard masks 220 and has a length (L2) 209. The control gate 232 is formed on the control gate dielectric 230. The control gate 232 can be formed from any suitable material such as poly-silicon or a metal. The control gate 232 can be formed between the hard masks 220 and can have a length (L3) 211 and can be planarized to the surface of the hard masks 220 by a suitable technique, such as CMP.

If the control gate is non-metal, the control gate 232 can be implanted and annealed after the control gate is formed and can be planarized to the surface of the hard masks 220. The control gate implant for a p-type memory cell can include doping the control gate 232 with an n-type dopant such as arsenic (As) or phosphorous (P) using an ion implantation at a dose of approximately $5\times10^{15}$ atoms/$cm^2$ to form a p-type doping concentration of approximately $2\times10^{20}$ atoms/$cm^3$ to a depth of approximately 100 nm. The control gate implant for an n-type memory cell can include doping the control gate with a p-type dopant such as boron (B) an ion implantation at a dose of approximately $5\times10^{15}$ atoms/$cm^2$ to form an n-type doping concentration of approximately $2\times10^{20}$ atoms/$cm^3$ to a depth of approximately 100 nm. Once the control gate is implanted, the control gate can be annealed to drive in and activate the control gate dopant. In one or more embodiments, the control gate can be annealed at a temperature in the range of approximately 850 degrees Celsius (° C.) to 1050° C. for approximately 5 seconds. These examples are given by way of illustration and not by way limitation.

Figure 3:
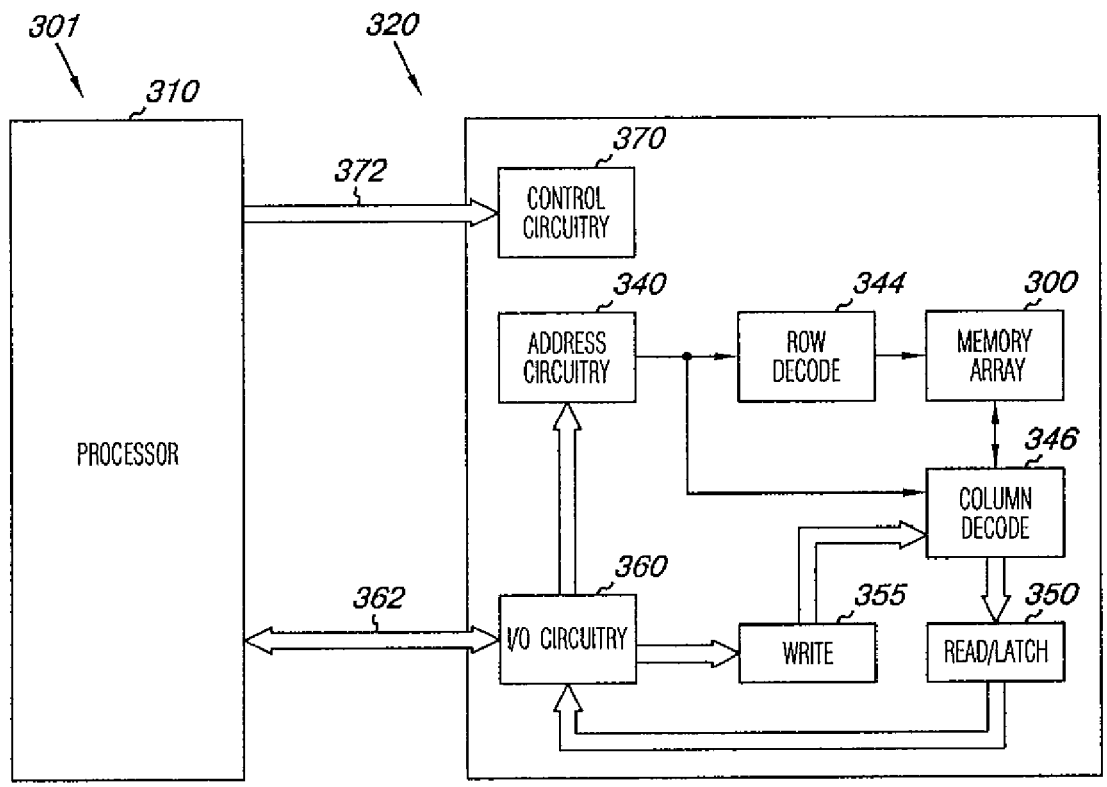
FIG. 3 is a functional block diagram of an electronic memory system having at least one memory device in accordance with an embodiment of the present disclosure.

FIG. 3 is a functional block diagram of an electronic memory system 301 including at least one memory device 320 having a memory cell in accordance with an embodiment of the present disclosure. Memory system 301 includes a processor 310 coupled to a memory device 320 that includes a memory array 300 of memory cells. The memory cells in the memory array 300 can be those having a storage node with a length that is less than the length of their channel. The memory device 320 can include an array 300 of non-volatile memory cells, e.g., floating gate memory cells, which can be arranged in a NAND architecture or a NOR architecture.

The memory system 301 can include separate integrated circuits or both the processor 310 and the memory device 320 can be on the same integrated circuit. The processor 310 can be a microprocessor or some other type of controlling circuitry such as an application-specific integrated circuit (ASIC).

The embodiment of FIG. 3 includes address circuitry 340 to latch address signals provided over I/O connections 362 through I/O circuitry 360. Address signals are received and decoded by a row decoder 344 and a column decoder 346 to access the memory array 300. In light of the present disclosure, it will be appreciated by those skilled in the art that the number of address input connections depends on the density and architecture of the memory array 300 and that the number of addresses increases with both increased numbers of memory cells and increased numbers of memory blocks and arrays.

The memory device 320 reads data in the memory array 300 by sensing voltage and/or current changes in the memory array columns using sense/buffer circuitry that in this embodiment can be read/latch circuitry 350. The read/latch circuitry 350 can read and latch a page or row of data from the memory array 300. I/O circuitry 360 is included for bi-directional data communication over the I/O connections 362 with the processor 310. Write circuitry 355 is included to write data to the memory array 300.

Control circuitry 370 decodes signals provided by control connections 372 from the processor 310. These signals can include chip signals, write enable signals, and address latch signals that are used to control the operations on the memory array 300, including data read, data write, and data erase operations. In one or more embodiments, the control circuitry 370 is responsible for executing instructions from the processor 310 to perform the operating embodiments of the present disclosure. The control circuitry 370 can be a state machine, a sequencer, or some other type of controller. It will be appreciated by those skilled in the art that additional circuitry and control signals can be provided, and that the memory device detail of FIG. 3 has been reduced to facilitate ease of illustration.

Figure 4:
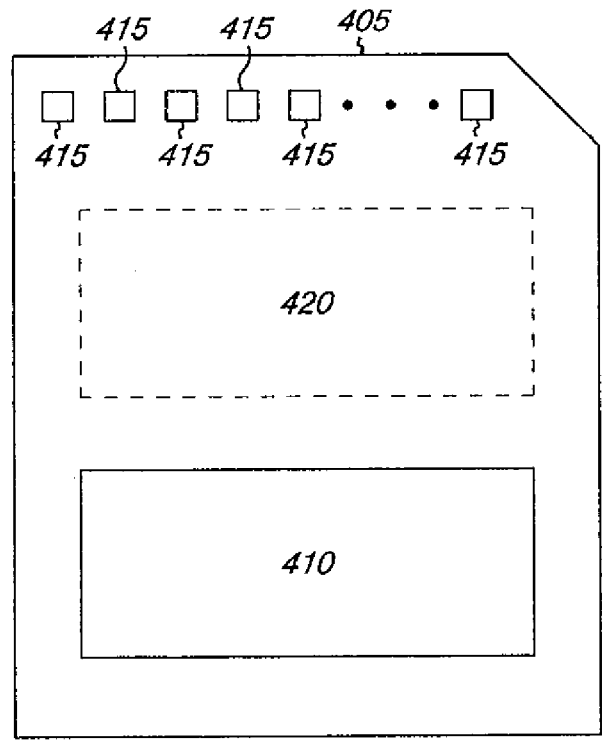
FIG. 4 is a functional block diagram of a memory module having at least one memory device in accordance with an embodiment of the present disclosure.

FIG. 4 is a functional block diagram of a memory module 400 including at least one memory device having a memory cell in accordance with an embodiment of the present disclosure. Memory module 400 is illustrated as a memory card, although the concepts discussed with reference to memory module 400 are applicable to other types of removable or portable memory (e.g., USB flash drives) and are intended to be within the scope of "memory module" as used herein. In addition, although one example form factor is depicted in FIG. 4, these concepts are applicable to other form factors as well.

In one or more embodiments, memory module 400 will include a housing 405 (as depicted) to enclose one or more memory devices 410, though such a housing is not essential to all devices or device applications. At least one memory device 410 includes an array of non-volatile memory cells and fuse circuitry that can be operated according to embodiments described herein. The memory cells in the memory device 410 can be a memory cell where the length of a storage node is less than a length of the channel. Where present, the housing 405 includes one or more contacts 415 for communication with a host device. Examples of host devices include digital cameras, digital recording and playback devices, PDAs, personal computers, memory card readers, interface hubs and the like. For one or more embodiments, the contacts 415 are in the form of a standardized interface. For example, with a USB flash drive, the contacts 415 might be in the form of a USB Type-A male connector. For one or more embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420, which may be one or more integrated circuits and/or discrete components. For one or more embodiments, the additional circuitry 420 may include control circuitry, such as a memory controller, for controlling access across multiple memory devices 410 and/or for providing a translation layer between an external host and a memory device 410. For example, there may not be a one-to-one correspondence between the number of contacts 415 and a number of 410 connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC. Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

CONCLUSION

Methods, devices, and systems for a memory cell are provided. One embodiment includes a memory cell with a storage node separated from a body region by a first dielectric, wherein the body region includes a channel separating a source and a drain region, and wherein a length of the storage node is less than a length of the channel. The embodiment further includes a memory cell with a gate separated from the storage node by a second dielectric, wherein a length of the gate is greater than a length of the storage node.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
  a storage node separated from a body region by a first dielectric, wherein the body region includes a channel separating a source and a drain region, wherein the storage node is a single continuous storage node and a length of the storage node is less than a length of the channel, and wherein the storage node is formed between sidewall spacers; and
  a gate separated from the storage node by a second dielectric, wherein the second dielectric is completely separated from the first dielectric by the storage node and a length of the gate is greater than a length of the storage node and wherein the second dielectric is formed on upper surfaces of the sidewall spacers.

2. The memory cell of claim 1, wherein the memory cell is a non-volatile memory cell, the storage node is a floating gate, and the gate is a control gate.

3. The memory cell of claim 2, wherein the storage node is formed of poly-silicon and separated from the body region by silicon dioxide ($SiO_2$).

4. The memory cell of claim 1, wherein the first dielectric has a thickness of less than 5 nanometers (nm).

5. The memory cell of claim 1, wherein the source and the drain region include source/drain extensions surrounded by a halo ion implantation.

6. The memory cell of claim 5, wherein the length of the storage node is less than a length of the channel between the source/drain extensions.

7. A memory cell, comprising:
  a first gate separated from a body region by a first dielectric, wherein the body region includes a channel separating a source and a drain region, wherein the first gate is a single continuous storage node and a length of the first gate is less than a length of the channel, and wherein the first gate is formed between sidewall spacers; and
  a second gate separated from the first gate by a second dielectric, wherein the second dielectric is completely separated from the first dielectric by the first gate and a length of the second gate is greater than a length of the first gate and wherein the second dielectric is formed on upper surfaces of the sidewall spacers.

8. The memory cell of claim 7, wherein the first dielectric separating the first gate from the body region has a thickness of less than 5 nanometers (nm).

9. The memory cell of claim 7, wherein the first gate is separated from the body region by a first dielectric having a thickness of less than 5 nm.

10. The memory cell of claim 7, wherein the source and the drain region include source/drain extensions surrounded by a halo ion implantation, wherein the length of the first gate is less than a length of the channel between the source/drain extensions.

11. The memory cell of claim 7, wherein the source and the drain region includes:
  a p-type source and drain having a Boron (B) dopant at a concentration of approximately $2\times10^{20}$ atoms/$cm^3$; and
  a halo ion implant underneath the p-type source drain having a concentration of approximately $2\times10^{18}$ atoms/$cm^3$.

12. The memory cell of claim 7, wherein the source and the drain region includes:
  an n-type source and drain having an Arsenic (As) dopant at a concentration of approximately $2\times10^{20}$ atoms/$cm^3$; and
  a halo ion implant underneath the n-type source and drain having a concentration of approximately $2\times10^{18}$ atoms/$cm^3$.

13. The memory cell of claim 7, wherein the first gate is a floating gate formed of poly-silicon and separated from the body region by silicon dioxide ($SiO_2$), and the second gate is a control gate.

14. The memory cell of claim 7, wherein the length of the first gate together with two adjoining spacers approximately equals the length of the channel.

15. A method for operating a memory cell, comprising:
  applying a programming voltage to a gate of the memory cell, wherein the gate is separated from a single continuous storage node by a first dielectric that is completely separated from a second dielectric by the single continuous storage node, wherein the single continuous storage node is formed between sidewall spacers and has a length which is less than the length of the gate, and wherein the first dielectric is formed on upper surfaces of the sidewall spacers;
  wherein applying the programming voltage includes direct tunneling a charge to the single continuous storage node having a length less than a length of a channel region separating a source and a drain region of the cell through the second dielectric having a thickness of less than 5 nanometers (nm).

16. The method of claim 15, wherein the method includes using Fowler-Nordheim tunneling.

17. The method of claim 15, wherein the storage node is a floating gate and wherein applying the programming voltage to the gate includes applying the programming voltage to a control gate having a length which is greater than a length of the floating gate.

18. The method of claim 15, wherein the memory cell includes a source region and a drain region with source/drain extensions surrounded by a halo ion implantation.

19. The method of claim 15, wherein a shallow trench isolation (STI) region isolates the memory cell from other memory cells.

20. The method of claim 15, wherein the method includes using channel hot electron injection.

* * * * *